(12) United States Patent
Nomura

(10) Patent No.: US 8,237,473 B2
(45) Date of Patent: Aug. 7, 2012

(54) SEMICONDUCTOR INTEGRATED CIRCUIT DEVICE HAVING PLURAL DELAY PATHS AND CONTROLLER CAPABLE OF BLOCKING SIGNAL TRANSMISSION IN DELAY PATH

(75) Inventor: Masahiro Nomura, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 287 days.

(21) Appl. No.: 12/588,993

(22) Filed: Nov. 4, 2009

(65) Prior Publication Data

US 2010/0117705 A1  May 13, 2010

(30) Foreign Application Priority Data

Nov. 11, 2008  (JP) ................................. 2008-288846

(51) Int. Cl.
*H03L 7/00*  (2006.01)

(52) U.S. Cl. ........ 327/141; 327/158; 327/163; 327/241; 331/1 A

(58) Field of Classification Search ............... 327/141, 327/261–264, 269, 270, 276–278, 161, 185, 327/199–203, 208–212, 214, 215, 218
See application file for complete search history.

(56) References Cited

U.S. PATENT DOCUMENTS

| | | | |
|---|---|---|---|
| 6,415,402 B2* | 7/2002 | Bishop et al. ................ | 714/724 |
| 6,438,054 B1* | 8/2002 | Kanazashi .................... | 365/219 |
| 6,486,716 B1* | 11/2002 | Minami et al. ................ | 327/152 |
| 6,813,724 B2* | 11/2004 | Saito ............................. | 713/401 |
| 7,630,275 B2* | 12/2009 | Fujisawa ...................... | 365/233.1 |
| 2002/0008560 A1* | 1/2002 | Yamazaki et al. ............. | 327/277 |
| 2002/0031016 A1* | 3/2002 | Sato et al. ..................... | 365/198 |
| 2002/0057614 A1* | 5/2002 | Kanazashi .................... | 365/219 |
| 2008/0031079 A1* | 2/2008 | Osawa et al. ................. | 365/233.1 |

FOREIGN PATENT DOCUMENTS

JP  2008-191939  8/2008

OTHER PUBLICATIONS

Chu, et al., "A Comparison of CMOS Circuit Techniques: Differential Cascade Voltage Switch Logic Versus Conventional Logic," IEEE Journal of Solid-state Circuits, vol. SC-22. pp. 528-532, Aug. 1987.

* cited by examiner

*Primary Examiner* — Lincoln Donovan
*Assistant Examiner* — Brandon S Cole
(74) *Attorney, Agent, or Firm* — McGinn IP Law Group, PLLC

(57) ABSTRACT

A plurality of delay paths are connected in parallel between two synchronous operation circuits operating in synchronism with a clock signal CLK, and enable transmission of a signal. A delay detection unit detects the respective delay times of the plurality of delay paths, and a control unit selects one delay path from among the plurality of delay paths based on the detection results from the delay detection unit, and controls the blocking of signal transmission in the delay paths other than the selected one delay path.

6 Claims, 15 Drawing Sheets

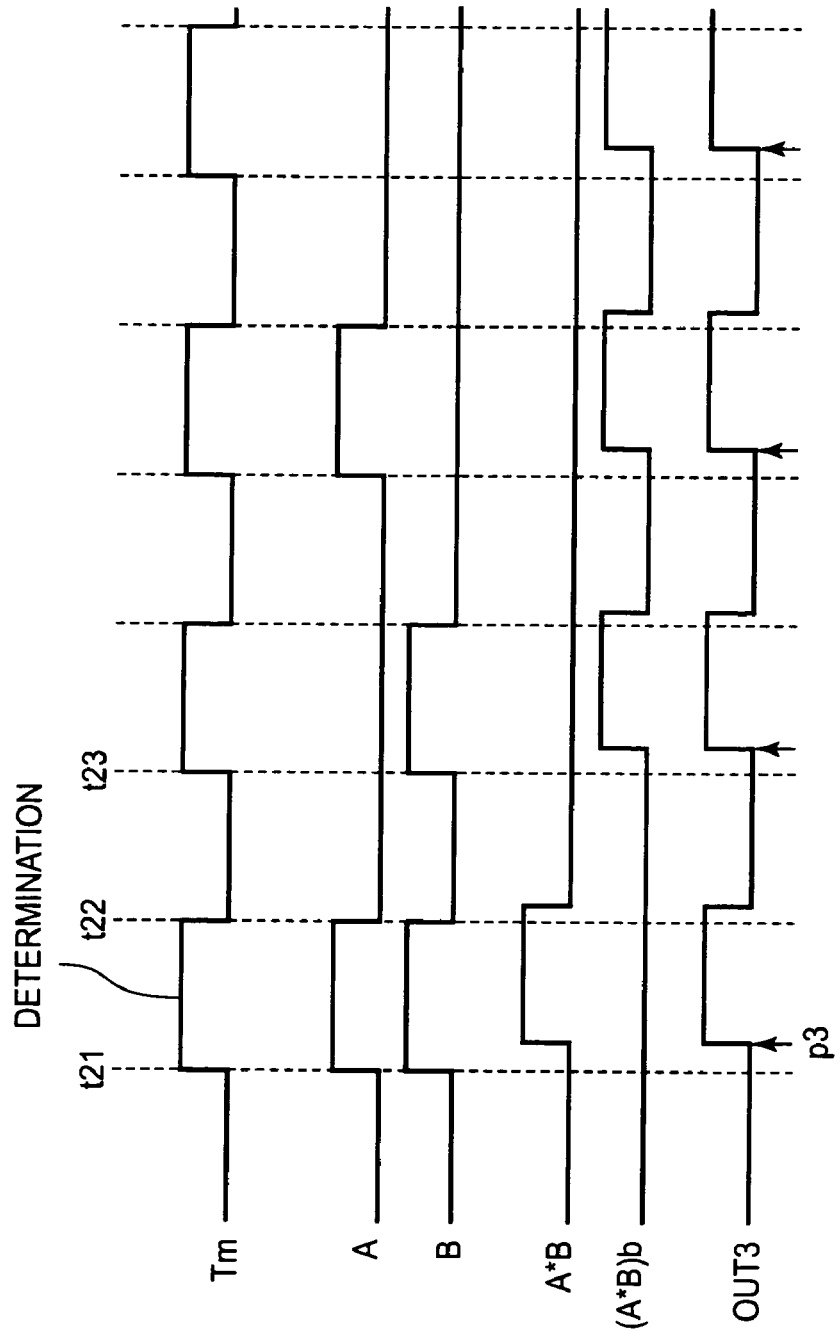

SEMICONDUCTOR INTEGRATED CIRCUIT DEVICE HAVING PLURAL DELAY PATHS AND CONTROLLER CAPABLE OF BLOCKING SIGNAL TRANSMISSION IN DELAY PATH

INCORPORATION BY REFERENCE

This application is based upon and claims the benefit of priority from Japanese Patent Application No. 2008-288846 which was filed on Nov. 11, 2008, the disclosure of which is incorporated herein in its entirety by reference.

BACKGROUND OF THE INVENTION

1. Field of the Invention

The present invention relates to a semiconductor integrated circuit device and a method for controlling a delay path, and more particularly to a semiconductor integrated circuit device for performing signal transmission between two circuits, and a method for controlling a delay path included therein.

2. Description of Related Art

When a logic circuit is constructed on the semiconductor integrated circuit device, a design is made to satisfy the conditions of a setup time and a hold time in terms of a delay time, taking variation of the devices into consideration in the worst cases. For example, a circuit that changes a transistor size, a threshold voltage, a gate type, the number of gate stages, or the like in a CMOS circuit to provide an appropriate delay time is inserted between two synchronous operation circuits that operate in synchronism with a clock signal so as to satisfy the condition of the hold time.

As a delay circuit inserted between the two synchronous operation circuits, for example, a stable delay time can be obtained with the use of the combination of a normal CMOS circuit with a DCVSL (differential cascade voltage switch logic) disclosed in non-patent document 1.

As a related art, patent document 1 discloses a redundant circuit device in which when a setting state is off in any system of a plurality of digital processor circuits, even if any one of the digital processor circuits in the normal systems is stopped, the validity of a majority vote result is ensured to maintain the reliability of the normal operation.

[Non-patent Document 1] Kan M. Chu and David L. Pulfrey, "A Comparison of CMOS Circuit Techniques: Differential Cascade Voltage Switch Logic Versus Conventional Logic," IEEE Journal of Solid-state Circuits, vol. SC-22. pp. 528-532, August 1987

[Patent Document 1] Japanese Patent Application Laid Open No. 2008-191939

SUMMARY

The following analysis is made in the present invention.

In recent years, the development of miniaturized semiconductor and lower voltage allows variation in device and variation in delay to increase. For that reason, a design assuming the worst is becoming gradually difficult. Consequently, there is proposed a multiplexed design in which a plurality of delay circuits are inserted between two synchronous operation circuits. For example, there is proposed a semiconductor integrated circuit device with the multiplexed design applying the majority vote result disclosed in Patent Document 1. However, in such a semiconductor integrated circuit device with the multiplexed design, there is a risk that because the multiplexed hardware continues to operate, the power consumption and the leakage current increase to deteriorate the power efficiency.

A semiconductor integrated circuit device according to one exemplary aspect of the present invention includes: a plurality of delay paths which are connected in parallel between two synchronous operation circuits operating in synchronism with a clock signal and enables transmission of a signal; a delay detection unit that detects the respective delay times of the plurality of delay paths; and a control unit that selects one delay path from the plurality of delay paths based on the detection results of the delay detection unit, and controls the blocking of signal transmission in the delay paths other than the selected one delay path.

A delay path control method according to another exemplary aspect of the present invention is directed to a method for controlling a plurality of delay paths which are connected in parallel between two synchronous operation circuits operating in synchronism with a clock signal and enables transmission of a signal, comprising the steps of: detecting the respective delay times of the plurality of delay paths; selecting one delay path from the plurality of delay paths based on the detection results of the delay times; and controlling the blocking of signal transmission in the delay paths other than the selected one delay path.

According to the exemplary aspects, since the signal transmission in the delay paths other than one delay path is blocked, the power efficiency is improved.

BRIEF DESCRIPTION OF THE DRAWINGS

The above and other exemplary aspects, advantages and features of the present invention will be more apparent from the following description of certain exemplary embodiments taken in conjunction with the accompanying drawings, in which:

FIG. 15 is a timing chart showing the operation of the unit logic gate circuit according to the sixth exemplary embodiment of the present invention.

DETAILED DESCRIPTION OF THE EXEMPLARY EMBODIMENTS

Figure 1:
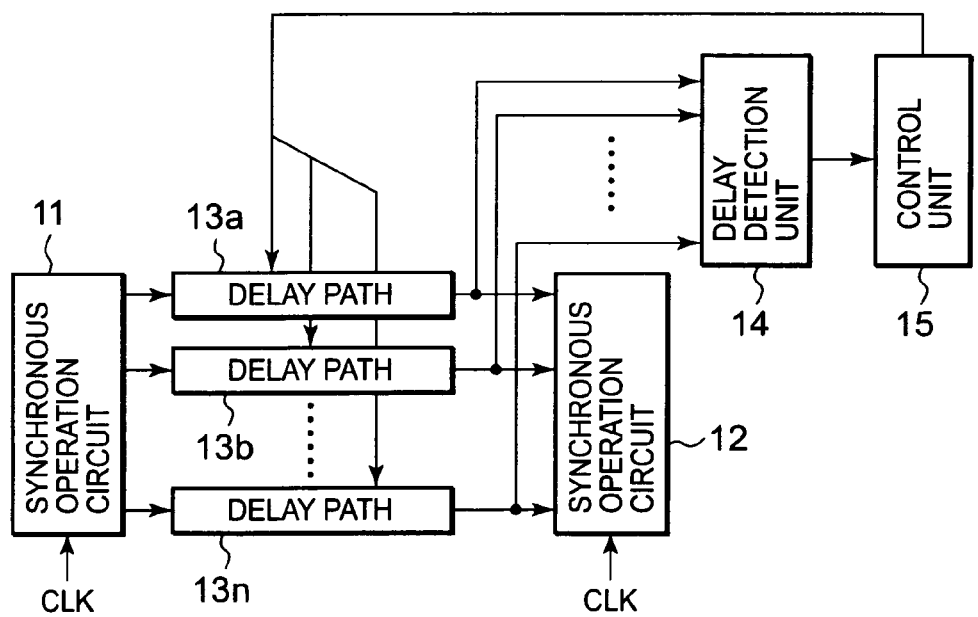
FIG. 1 is a diagram showing the configuration of a semiconductor integrated circuit device according to an exemplary embodiment of the present invention.

FIG. 1 is a diagram showing the configuration of a semiconductor integrated circuit device according to an exemplary embodiment of the present invention. Referring to FIG. 1, the semiconductor integrated circuit device includes a plurality of delay paths 13a, 13b, . . . , 13n which are connected in parallel between two synchronous operation circuits 11 and 12 operating in synchronism with a clock signal CLK, and enables transmission of a signal, a delay detection unit 14 that detects the respective delay times of the plurality of delay paths 13a, 13b, . . . , 13n, and a control unit 15 that selects one delay path from among the plurality of delay paths 13a, 13b, . . . , 13n based on the detection results from the delay detection unit 14, and controls the blocking of signal transmission in the delay paths other than the selected one delay path. According to the above semiconductor integrated circuit device, since the signal transmission in the delay paths other than the selected one delay path is blocked, the power efficiency in the semiconductor integrated circuit device is improved.

The plurality of delay paths may be each configured to include an active circuit that operates upon receiving power supply, and the control unit may stop power supply to the active circuits in the delay circuits other than the one delay path during normal operation.

Each active circuit may be formed of a combinational logic circuit.

The control unit may select, as one delay path, a delay path whose delay time is a minimum value among the plurality of delay paths. According to this control, the speed performance can be improved by excluding the delay paths larger in delay which are attributable to a variation in the device.

The control unit may select, as one delay path, a delay path whose delay time is a middle value among the plurality of delay paths. According to this control, an excessive leakage current expected in a high-speed delay path can be reduced by excluding the delay paths smaller in delay which are attributable to a variation in the device.

Further, the control unit may reduce a power supply voltage in the selected one delay path down to a given voltage. According to this control, the power supply voltage can be reduced for a desired performance to improve the power efficiency.

The control unit may select one delay path in correspondence with power supply voltages to the plurality of delay paths. According to this control, a sufficient delay margin can be ensured by selecting an appropriate delay path for each power supply voltage.

The delay detection unit may include two registers different in latch timing from each other in correspondence with the plurality of delay paths, respectively, and the control unit may select one delay path based on a delay time order in the plurality of delay paths, which are obtained based on latch data of the two registers in the case where the latch timing is changed.

One of the two registers may operate in the latch timing of the clock signal during the normal operation.

Each delay path may be formed of a logic circuit operating complementarily, and function to operate complementarily during detection of the delay time through the delay detection unit.

Each delay path may be formed of a double rail logic circuit, function as the double rail logic circuit during detection of the delay time through the delay detection unit, and function as the double rail logic circuit or a single rail logic circuit during the normal operation. The use of the above double rail logic circuit enables the delay detection to be efficiently executed. When the delay path is allowed to function as the single rail logic circuit during the normal operation, the power consumption is reduced.

The delay detection unit may detect a change order of logic values in the double rail logic circuit during detection of the delay time.

Further, each delay path may be formed of a dynamic circuit, function as the dynamic circuit during detection of the delay time through the delay detection unit, and function as a static circuit during the normal operation. The use of the above double rail logic circuit enables the delay detection to be efficiently executed. When the delay path is allowed to function as the static circuit during the normal operation, the power consumption is reduced.

Each delay path may be formed of a static circuit, and function as the static circuit during detection of the delay time through the delay detection unit and during the normal operation.

Hereinafter, a description will be given in detail of the respective parts of the semiconductor integrated circuit device based on exemplary embodiments with reference to the drawings.

[Exemplary Embodiment 1]

Figure 2:
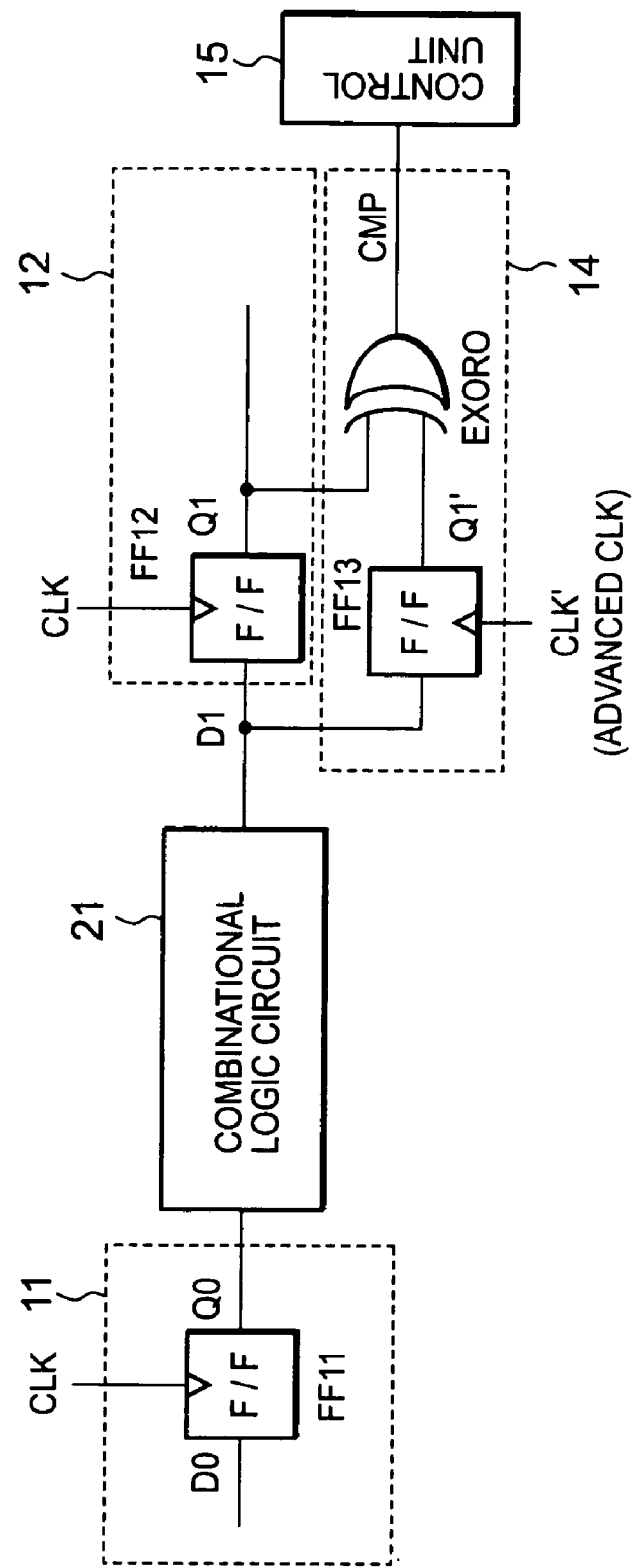
FIG. 2 is a circuit diagram of a main portion of a semiconductor integrated circuit device according to a first exemplary embodiment of the present invention.

FIG. 2 is a circuit diagram showing a main portion of a semiconductor integrated circuit device according to a first exemplary embodiment of the present invention. Referring to FIG. 2, a combinational logic circuit 21 corresponds to one of the delay paths 13a, 13b, . . . 13n in FIG. 1. A flip flop circuit FF11 is a flip flop circuit at a final stage in the synchronous operation circuit 11, which is disposed in correspondence with each of the delay paths, and outputs a latched signal to the combinational logic circuit 21 in response to a clock signal CLK. A flip flop circuit FF12 is a flip flop circuit at an initial stage in the synchronous operation circuit 2, which is disposed in correspondence with each of the delay paths, and latches an output of the combinational logic circuit 21 in response to the clock signal CLK. The delay detection unit 14 has a flip flop circuit FF13, and an exclusive OR circuit XOR0 in correspondence with one delay path in FIG. 1.

The flip flop circuit FF13 latches the output of the combinational logic circuit 21 in response to a clock signal CLK'. The clock signal CLK' is a clock signal preceding the clock signal CLK by a given delay amount, and, for example, supplied from a high order of a clock tree (a side closer to a supply source) that distributes the clock signal CLK.

The exclusive OR circuit EXOR0 executes the exclusive OR operation of the respective output signals Q and Q' of the flip flop circuits FF12 and FF13, and outputs a comparison result signal CMP being an operation result to the control unit 15.

Figure 3:
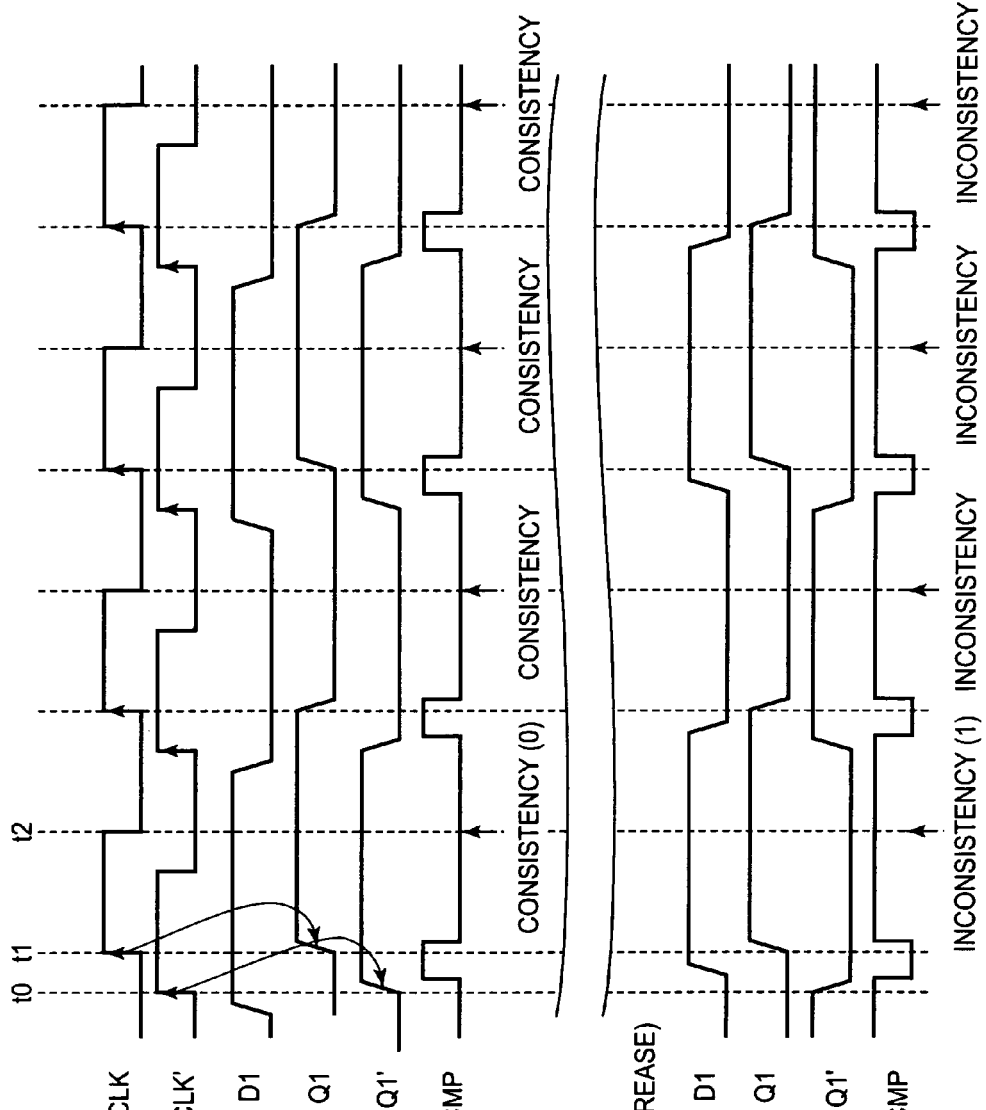
FIG. 3 is a timing chart showing the operation of a main portion of the semiconductor integrated circuit device according to the first exemplary embodiment of the present invention.

Subsequently, the operation of the circuit shown in FIG. 2 will be described. FIG. 3 is a timing chart showing the operation of the main portion of the semiconductor integrated circuit device according to the first exemplary embodiment of the present invention. An output D1 of the combinational logic circuit 21 is latched at a time t1 being a rising edge of the clock signal CLK and at a time t0 being a rising edge of the clock signal CLK' preceding the clock signal CLK by the given delay amount, respectively, and output as output signals Q and Q'. The output signals Q and Q' are subjected to the exclusive OR operation into the comparison result signal CMP. In FIG. 3A, since H level is latched as the output signals Q and Q', consistency (L level, 0) is output as the comparison result signal CMP at a time t2 being a falling edge of the clock signal CLK. That is, the combinational logic circuit 21 is capable of outputting D1=H level even at the time t0, and has an allowance for the delay time.

On the contrary, referring to FIG. 3B, when a frequency of the clock signal CLK increases, the output D1 of the combinational logic circuit 21 increases a relative delay amount. In FIGS. 3A and 3B, for simplification of drawings, it is assumed that a period of the clock signal CLK is identical in the drawings. For that reason, the flip flop circuit FF13 cannot finally latch that the output D1 is in the H level at the time t0, and outputs L level as the output signal Q' at the time to. Accordingly, at the time t2 being the falling edge of the clock signal CLK, the flip flop circuit FF13 outputs inconsistency (H level, 1) as the comparison result signal CMP.

Figure 4:
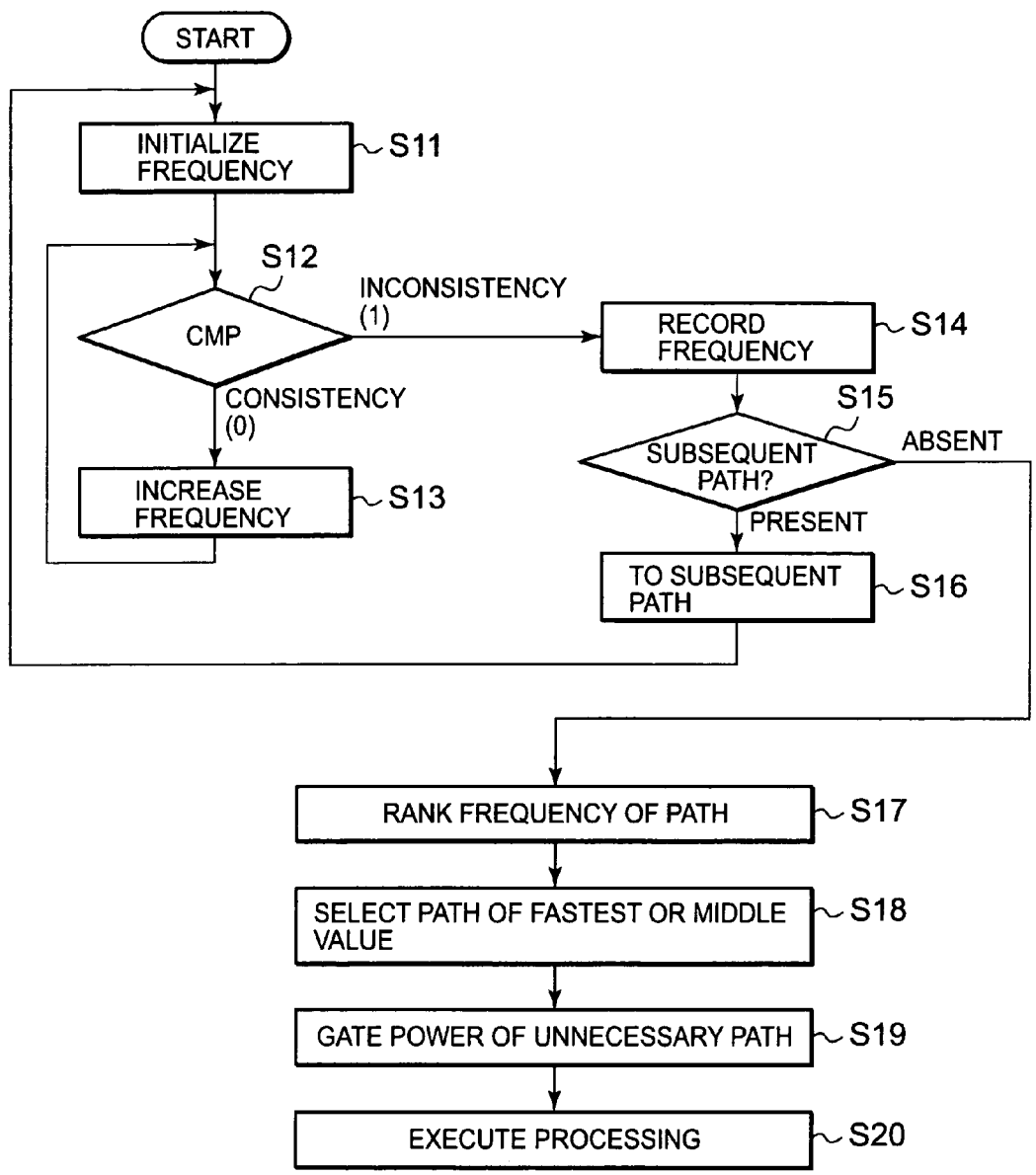
FIG. 4 is a flowchart showing the operation of a control unit in the semiconductor integrated circuit device according to the first exemplary embodiment of the present invention.

The control unit 15 increases the frequency of the clock signal CLK in this way, and observes the comparison result signals CMP in the plurality of delay paths to detect the delays in the plurality of delay paths, respectively. FIG. 4 is a flowchart showing the operation of the control unit in the semiconductor integrated circuit device according to the first exemplary embodiment of the present invention.

In Step S11, the control unit 15 initializes the frequency of the clock signal CLK which is given each delay paths (combinational logic circuit 12).

In Step S12, the control unit 15 checks whether the comparison result signal CMP of the exclusive OR circuit EXOR0 corresponding to the first delay path to be detected is indicative of consistency (0), or not. When the comparison result signal CMP is indicative of consistency (0), the control unit 15 increases the frequency of the clock signal CLK by a given amount in Step S13, and returns to Step S12.

When the comparison result signal CMP is indicative of inconsistency (1), the control unit 15 records a value of the frequency of the clock signal CLK in Step S14.

In Step S15, the control unit 15 checks whether there is a subsequent path (delay path) to be detected, or not. When there is the subsequent path, the control unit 15 selects a detection target as the subsequent path in Step S16, and returns to Step S11.

When there is no subsequent path in Step S15, since the delay detection in all of the paths has been executed, the control unit 15 ranks the frequencies recorded with respect to all of the paths in Step S17.

In Step S18, the control unit 15 selects, as one delay path, a path whose delay time is a fastest value or a middle value based on the ranking of the frequency. As usual, the control unit 15 selects the path whose delay time is the fastest. However, in the case of the path whose delay time is the fastest, there is the possibility that a flip flop circuit at the subsequent stage allows data to pass therethrough without latching the data. There is a high possibility that a transistor large in leakage current exists in the fastest path. In this case, the control unit 15 selects a path whose delay time is a middle value so as to allocate an appropriate delay time. In this example, the control unit 5 selects the path whose delay time is the fastest or middle value, but this selection is not strictly required. That is, a second highest value or values close to the middle value may be selected as occasion demands.

In Step S19, the control unit 15 ceases power supply in the delay paths other than the selected one delay path (power gating).

In Step S20, signal transmission is conducted through the selected one delay path as the normal operation.

As described above, the control unit 15 is capable of detecting the length of the respective delay times of the respective delay paths, that is, the combinational logic circuit 21 based on an upper limit of the frequency when the frequency of the clock signal CLK increases. The configuration using the two flip flop circuits FF12 and FF13 that detects the consistency or inconsistency of the output has been known as RazorFF.

The above-mentioned semiconductor integrated circuit selects one delay path whose delay time is a minimum (fastest) or middle value from among a plurality of delay paths, ceases power supply in the delay paths other than the selected one delay path, and conducts signal transmission through the selected one delay path. Accordingly, the current consumption (switching current and leakage current) in the delay paths other than the one delay path is almost eliminated to improve the power efficiency.

[Exemplary Embodiment 2]

Figure 5:
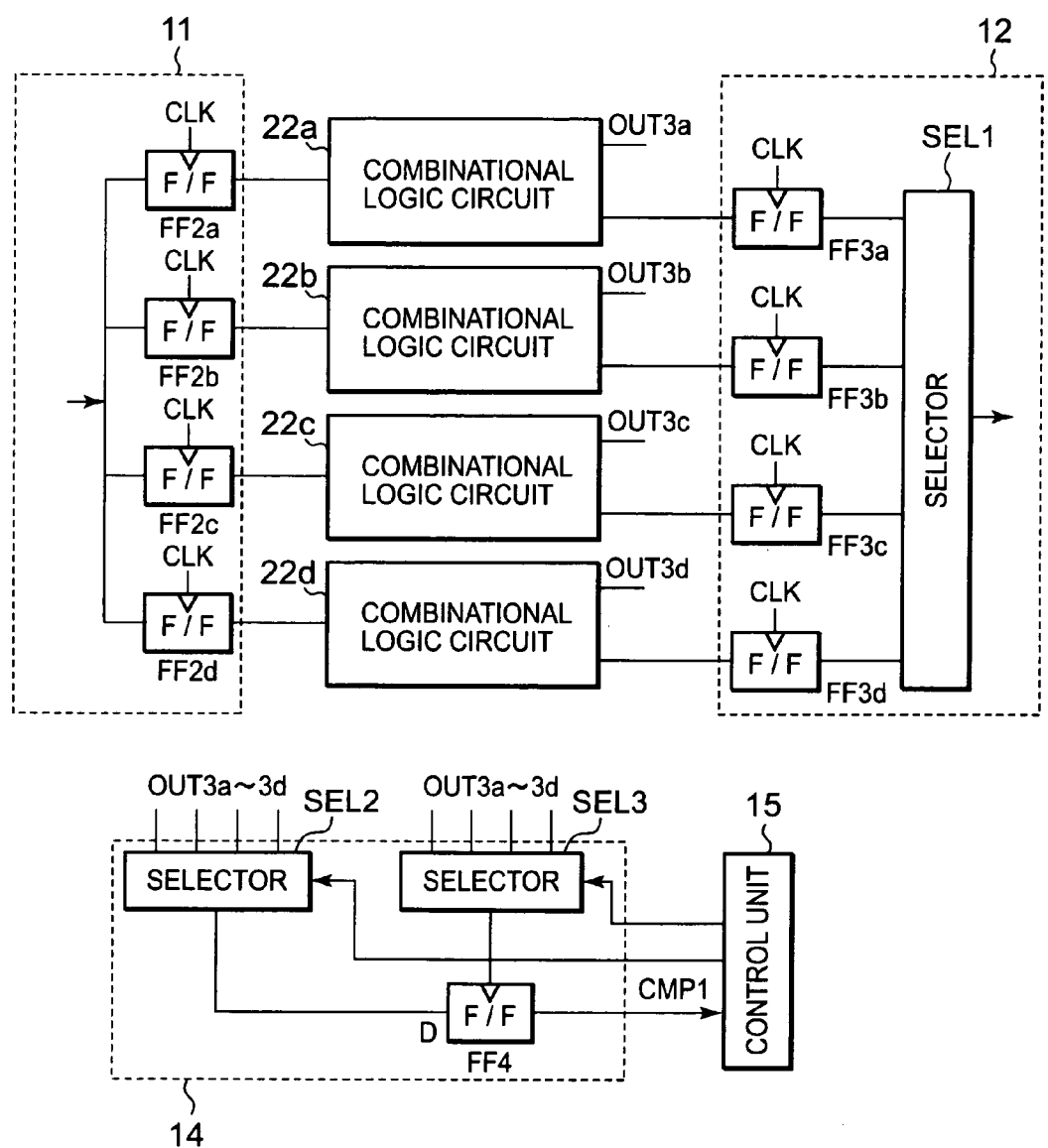
FIG. 5 is a circuit diagram of a main portion of a semiconductor integrated circuit device according to a second exemplary embodiment of the present invention.

FIG. 5 is a circuit diagram showing a main portion of a semiconductor integrated circuit device according to a second exemplary embodiment of the present invention. Referring to FIG. 5, combinational logic circuits 22a, 22b, 22c, and 22d correspond to the delay paths shown in FIG. 1, respectively. In this example, the number of delay paths (paths) being the combinational logic circuits is four, but the present invention is not limited to this configuration. The combinational logic circuits 22a, 22b, 22c, and 22d are each formed of the combination of unit logic gate circuits as in exemplary embodiments 5 and 6 which will be described later, and output exclusive OR as OUT3a, OUT3b, OUT3c, and OUT3d at a final stage in the combinational logic circuits, that is, in the unit logic gate circuits adjacent to the synchronous operation circuit 12.

Flip flop circuits FF2a, FF2b, FF2c, and FF3d are flip flop circuits at a final stage of the synchronous operation circuit 11, which are disposed in correspondence with the delay paths, respectively, and output signals latched in response to the clock signal CLK to the combinational logic circuits 22a, 22b, 22c, and 22d, respectively. Flip flop circuits FF3a, FF3b, FF3c, and FF3d are flip flop circuits at an initial stage in the synchronous operation circuit 12, which are disposed in correspondence with the delay paths, respectively, and latch the respective outputs of the combinational logic circuits 22a, 22b, 22c, and 22d in response to the clock signal CLK. A selector SEL1 selectively outputs any one output of the flip flop circuits FF3a, FF3b, FF3c, and FF3d. Since the flip flop circuit is large in chip area, the flip flop circuits FF2a, FF2b, FF2c, and FF2d may be assembled together. The flip flop circuits FF3a, FF3b, FF3c, and FF3d can be formed of the selector and one flip flop circuit.

The delay detection unit 14 includes selectors SEL2, SEL3, and a flip flop circuit FF4. The selector SEL2 selects any one of OUT3a, OUT3b, OUT3c, and OUT3d under the control of the control unit 15 which will be described below, and outputs the selected one to a terminal D of the flip flop circuit FF4. The selector SEL3 selects any one of OUT3a, OUT3b, OUT3c, and OUT3d under the control of the control unit 15, and outputs the selected one to a clock terminal of the flip flop circuit FF4. The flip flop circuit FF4 functions as a phase comparator that latches a signal of the terminal D in response to the rising edge of the signal of the clock terminal, and outputs a signal CMP1 to the control unit 15.

Figure 6:
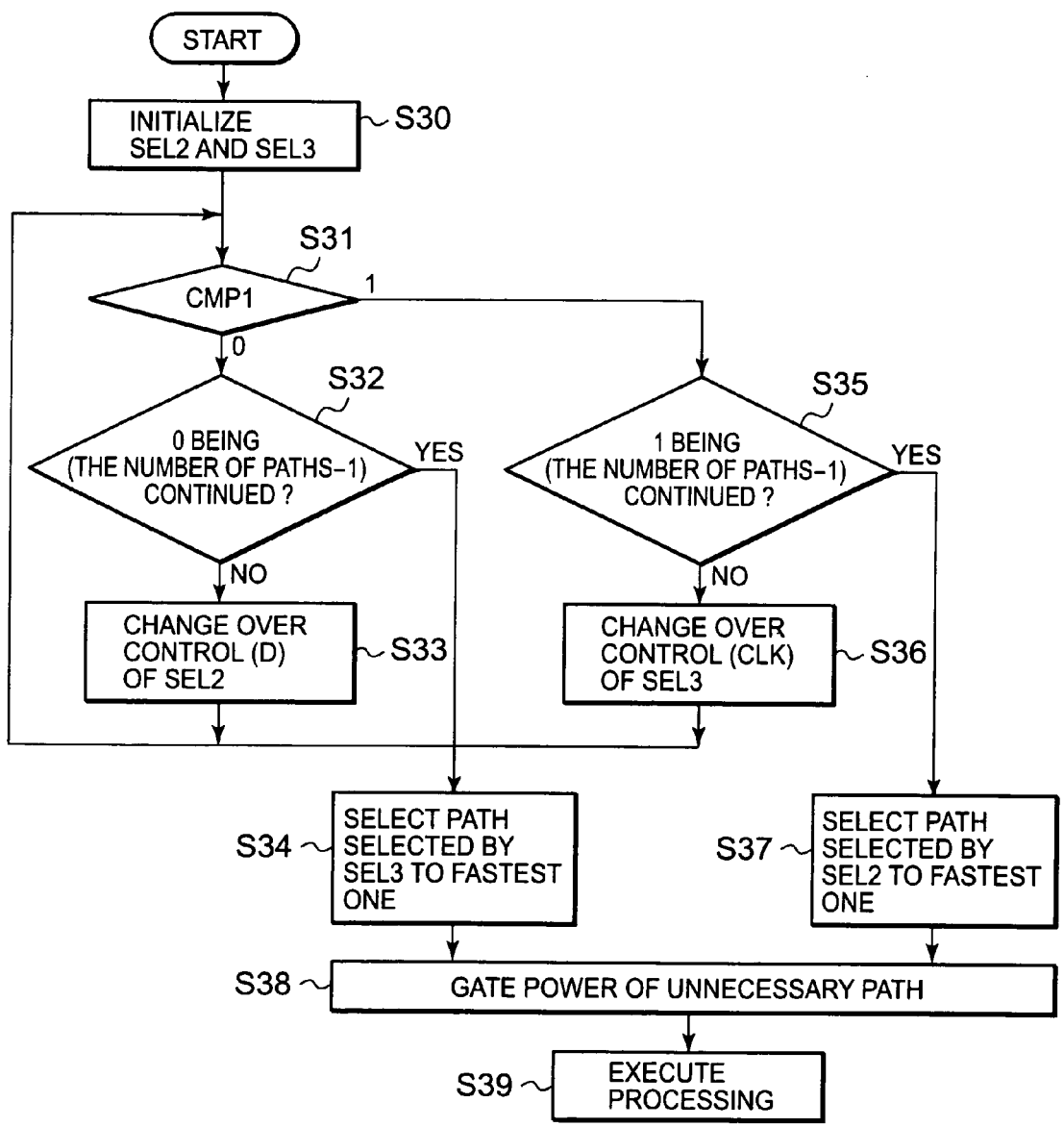
FIG. 6 is a flowchart showing a first operation of a control unit according to the second exemplary embodiment of the present invention.

Subsequently, the operation of the control unit 15 according to the second exemplary embodiment will be described. FIG. 6 is a flowchart showing a first operation of the control unit according to the second exemplary embodiment of the present invention. In this example, the control unit 15 selects a path whose delay time is the minimum (fastest) by the delay detection unit 14.

In Step 30, the control unit 15 initializes the selectors SEL2 and SEL3. For example, the control unit 15 performs control so that the selector SEL2 selects OUT3b, and the selector SEL3 selects OUT3a.

In Step 31, the control unit 15 determines whether the signal CMP1 is 0 or 1. That is, that the signal CMP1 is 0 means that the rising edge of OUT3b is later than the rising edge of OUT3a, and the flip flop circuit FF4 latches 0. Accordingly, it is determined that the combinational logic circuit 22a is shorter in delay time than the combinational logic circuit 22b. That the signal CMP1 is 1 means that the rising edge of OUT3b is earlier than the rising edge of OUT3a, and the combinational logic circuit 22a is longer in delay time than the combinational logic circuit 22b.

In Step 32, the control unit 15 checks whether the combination in which the signal CMP1 at the time of changing over the selector SEL2 is 0 continues for "the number of paths—1", or not.

When the combination does not continue for "the number of paths—1", in Step 33, the control unit 15 changes over the selector SEL2 to a subsequent selection target. For example, the control unit 15 selects OUT3c. Then, the control unit 15 returns to Step S31.

In Step 32, when the combination continues for "the number of paths—1", it is meant that all selections of the selector SEL2 have been completed. In Step 34, the control unit 15 selects the combinational logic circuit corresponding to OUT3x (x=any one of a to d) selected by the selector SEL3 as the fastest path, and proceeds to Step 38.

On the other hand, when the signal CMP1 is 1 in Step 31, the control unit 15 checks whether the combination in which the signal CMP1 at the time of changing over the selector SEL2 is 1 continues for "the number of paths—1", or not, in Step 35.

When the combination does not continue for "the number of paths—1", in Step 36, the control unit 15 changes over the selector SEL3 to a subsequent selection target. For example, the control unit 15 selects OUT3c. Then, the control unit 15 returns to Step S31.

In Step 35, when the combination continues for "the number of paths—1", it is meant that all selections of the selector SEL3 have been completed. In Step 37, the control unit 15 selects the combinational logic circuit corresponding to OUT3x (x=any one of a to d) selected by the selector SEL2 as the fastest path, and proceeds to Step 38.

In Step 38, the control unit 15 cuts off power supply (power gating) to the unselected paths, that is, paths being not the fastest as unnecessary paths.

In Step 39, the control unit 15 conducts signal transmission through one delay path as the normal operation with the selected path, that is, the fastest path as the one delay path.

The control unit 15 operates as described above, compares the phases of input signals to the terminal D and the clock terminal of the flip flop circuit FF4 with each other while changing over the selectors SEL2 and SEL3, respectively, and selects a path whose delay time is the minimum (fastest).

Figure 7:
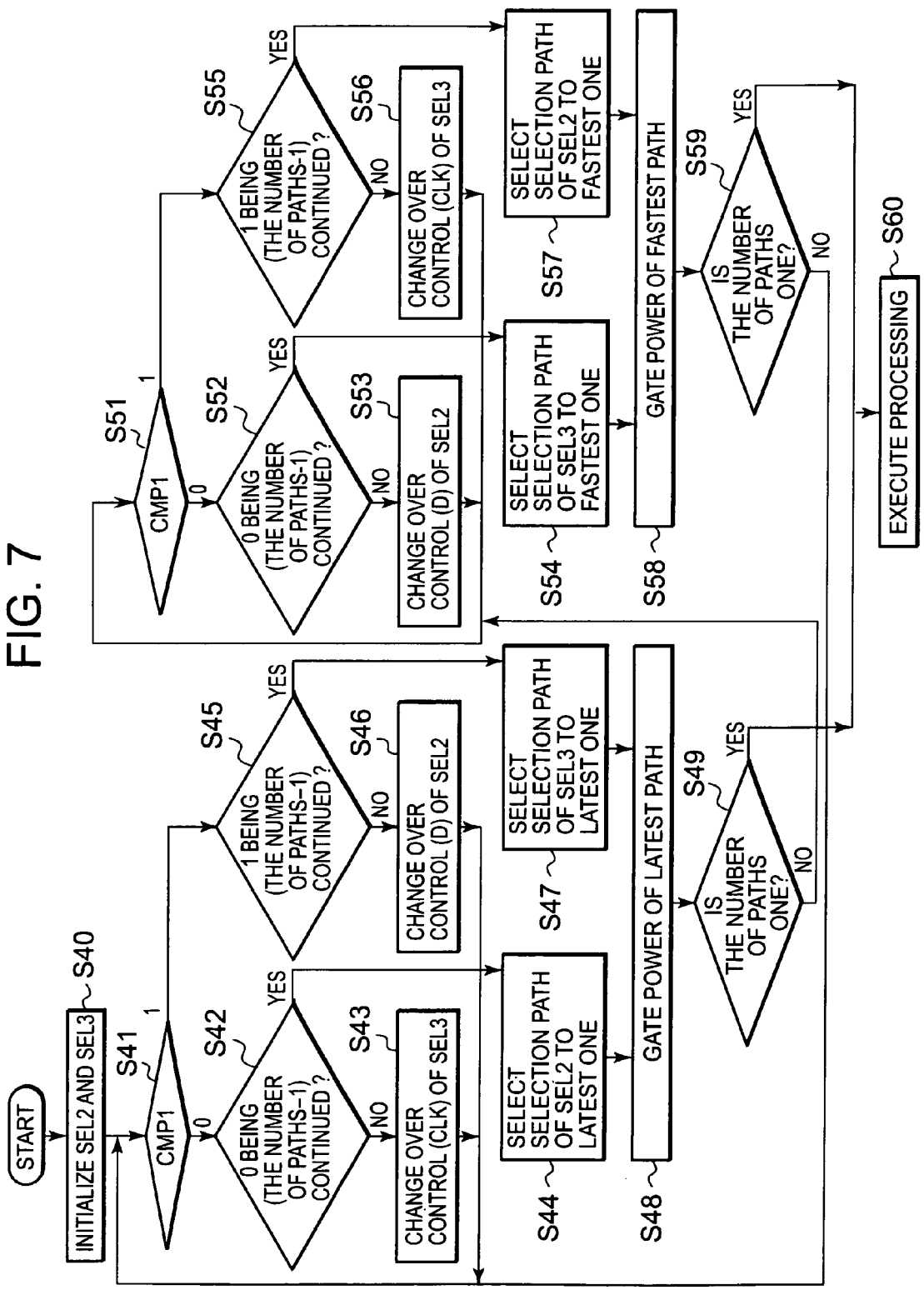
FIG. 7 is a flowchart showing a second operation of the control unit according to the second exemplary embodiment of the present invention.

FIG. 7 is a flowchart showing a second operation of the control unit according to the second exemplary embodiment of the present invention. In this example, the control unit 15 selects a path whose delay time is a middle value by the delay detection unit 14.

In Step S40, the control unit 15 initializes the selectors SEL2 and SEL3. Steps S41 to S48 are processing for selecting the latest path, and cutting off power supply (power gating) to the selected path as an unnecessary path while changing over the selectors SEL2 and SEL3. Steps S51 to S58 are processing for selecting the fastest path, and cutting off power supply (power gating) to the selected path as an unnecessary path while changing over the selectors SEL2 and SEL3. Those processing performs the same processing as that in Steps S31 to S38 in FIG. 6, respectively.

The control unit 15 processes Steps S41 to S49 to continuously remove the latest path, and the control unit 15 processes Steps S51 to S59 to continuously remove the fastest path, as a result of which one path remaining in Step S49 or S59 is a path whose delay time is a middle value.

In Step 60, the selected path, that is, the path whose delay time is the middle path is one delay path, and signal transmission is conducted through one delay path as the normal operation.

According to the semiconductor integrated circuit described above, the current consumption (switching current or leakage current) in the delay paths other than one delay path is almost eliminated as in the exemplary embodiment 1, to thereby improve the power efficiency.

[Exemplary Embodiment 3]

Figure 8:
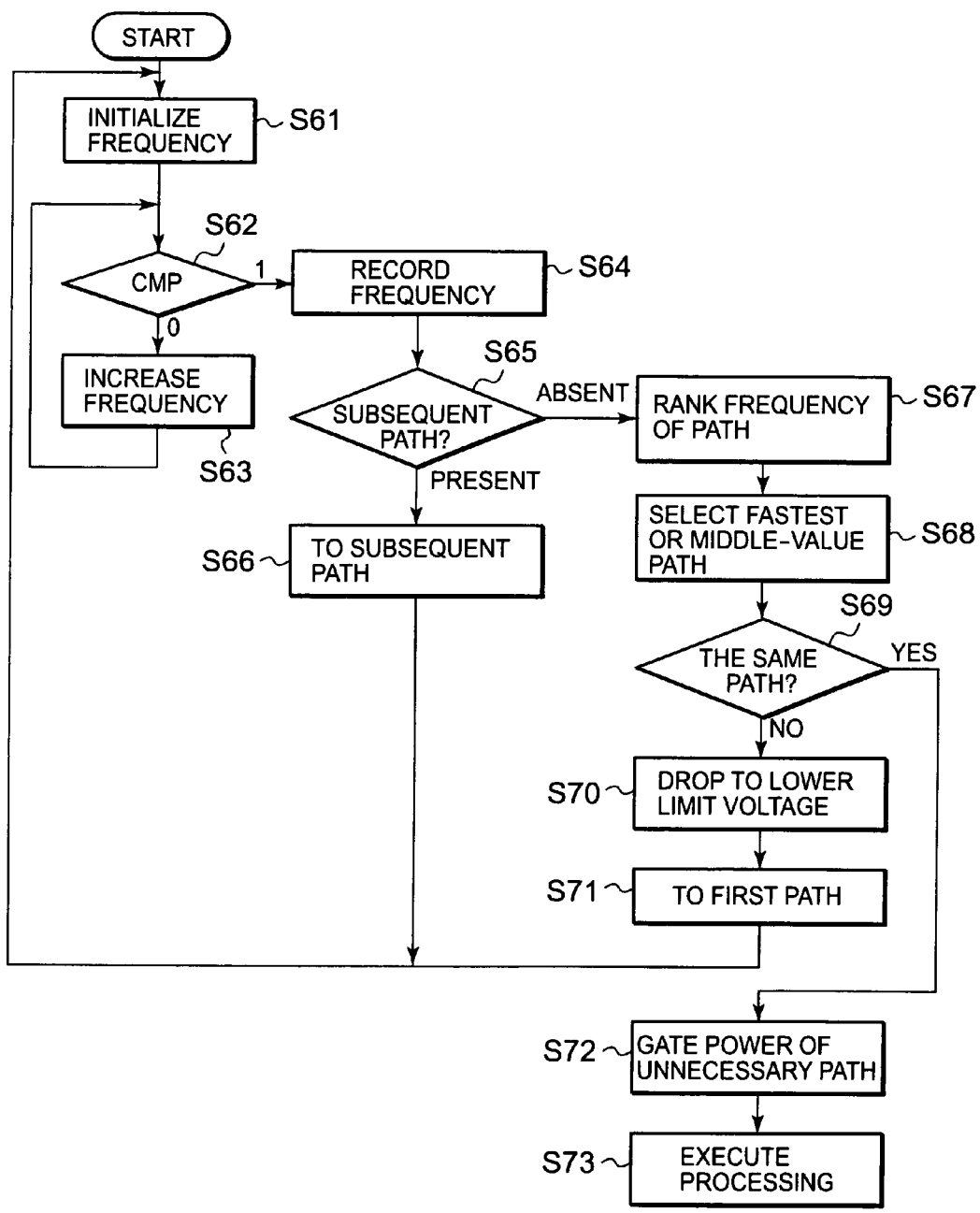
FIG. 8 is a flowchart showing the operation of a control unit according to a third exemplary embodiment of the present invention.

FIG. 8 is a flowchart showing the operation of a control unit according to a third exemplary embodiment of the present invention. In this example, the control unit 15 is applied to a case in which one delay path selected every time the power supply voltage in the delay path is changed can be changed. The control unit 15 selects a path whose delay time is a minimum (fastest) or middle value by the delay detection unit 14. Referring to FIG. 8, Since Steps S61 to S68, S72, and S73 conduct the same processing as that of Steps S11 to S18, S19, and S20 in FIG. 4, its description will be omitted.

In Step S69, the control unit 15 determines whether a path selected in the previous power supply voltage is identical with a path selected in the present power supply voltage, or not. In the case where the former is identical with the latter, the control unit 15 advances to Step S72. When the former is not identical with the latter, in Step S70, the control unit 15 decreases the power supply voltage by a given amount. In order to select the path whose delay time is gain the fastest or middle value as one delay path by the decreased power supply voltage, the control unit 15 sets the first path to be detected in Step S71, and returns to Step S61.

The control unit 15 operates as described above, and selects, when the selected delay path is not changed even if the power supply voltage is changed, the delay path as one delay path. Then, signal transmission is conducted through one delay path as the normal operation.

According to the semiconductor integrated circuit described above, the current consumption (switching current or leakage current) in the delay paths other than one delay path is almost eliminated as in the exemplary embodiment 1, to thereby improve the power efficiency. Further, even if the power supply voltage is changed, one delay path is stably held.

[Exemplary Embodiment 4]

Figure 9:
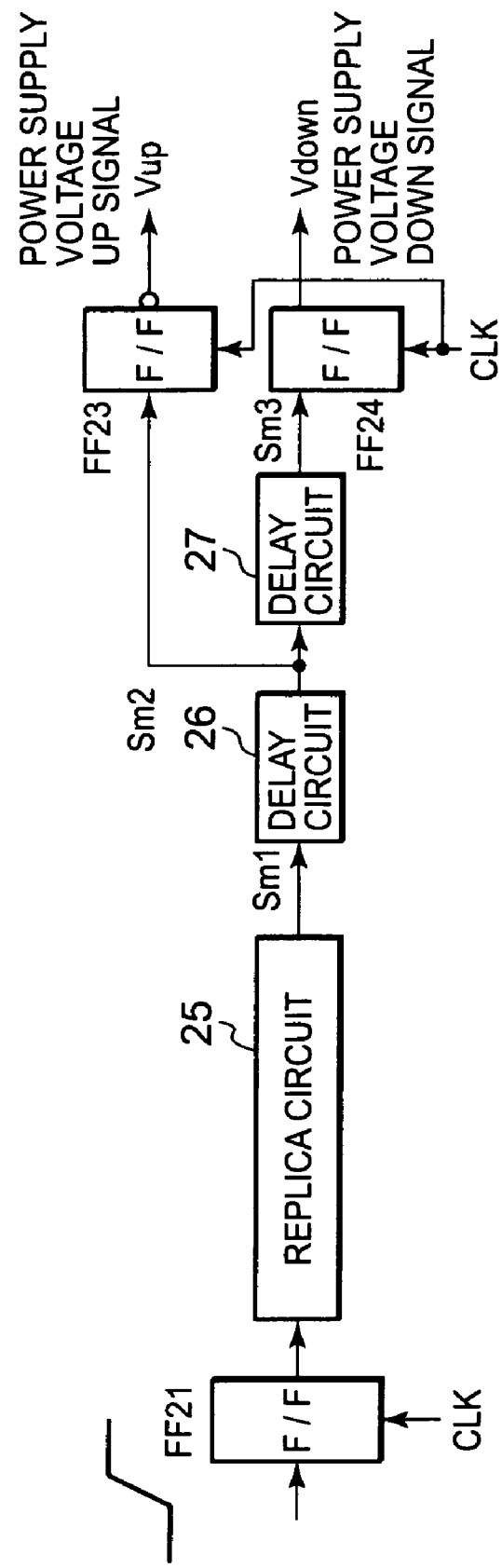
FIG. 9 is a circuit diagram showing a power supply voltage control delay monitor according to a fourth exemplary embodiment of the present invention.

FIG. 9 is a circuit diagram showing a power supply voltage control delay monitor according to a fourth exemplary embodiment of the present invention. Referring to FIG. 9, a replica circuit 25 is a circuit which is disposed in correspondence with the delay paths in FIG. 1, and whose delay time can be set to be equivalent to the delay time of one delay path selected in the first or second exemplary embodiment.

A flip flop circuit FF21 is a circuit equivalent to the flip flop circuit in FIG. 1 or the flip flop circuits FF2a to FF2d in FIG. 5. The replica circuit 25 receives an output of the flip flop circuit FF21, and outputs an output signal to a delay circuit 26. The delay circuit 26 delays the output signal of the replica circuit 25 by a given amount, and outputs the delayed signal to a flip flop circuit FF23 and a delay circuit 27. The delay circuit 27 delays an output signal of the delay circuit 26 by a given amount, and outputs the delayed signal to a flip flop circuit FF24. The flip flop circuits FF23 and FF24 latch the respective input signals in response to the clock signal CLK. The flip flop circuit FF23 outputs an inversion output signal as a power supply voltage up signal Vup. The flip flop circuit FF24 outputs a power supply voltage down signal Vdown.

Figure 10:
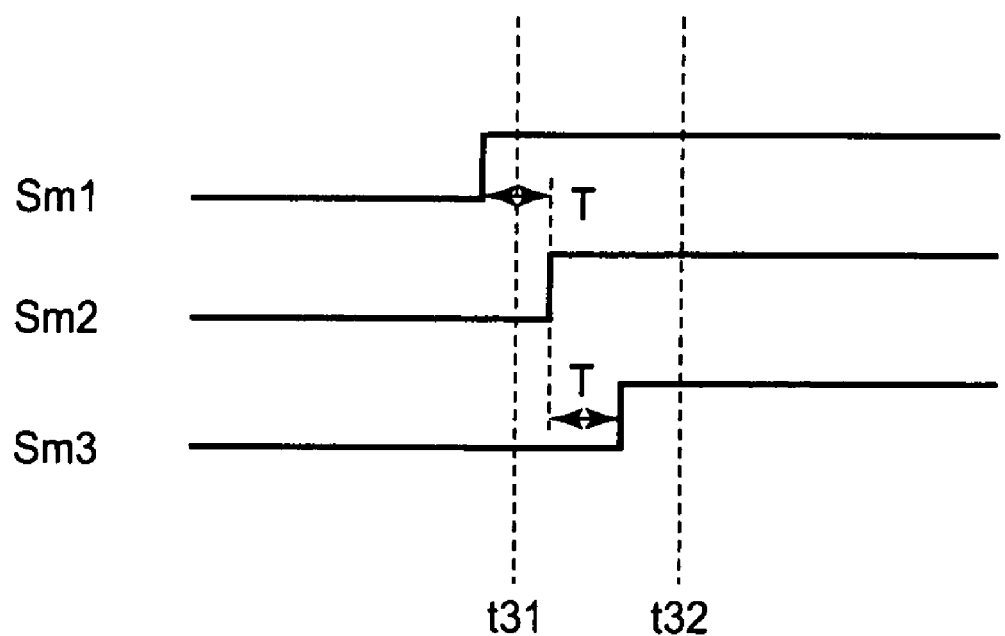
FIG. 10 is a timing chart showing the operation of the power supply voltage control delay monitor according to the fourth exemplary embodiment of the present invention.

Subsequently, the operation of the power supply voltage control delay monitor thus configured will be described. FIG. 10 is a timing chart showing the operation of the power supply voltage control delay monitor according to the fourth exemplary embodiment of the present invention. FIG. 10 is a timing chart showing the operation of the power supply voltage control delay monitor according to the fourth exemplary embodiment of the present invention. In this example, it is assumed that the output signals of the replica circuit 25 and the delay circuit 26, 27 are Sm1, Sm2, and Sm3, respectively, and the delay time of the delay circuits 26 and 27 is T.

When the latch time of the flip flop circuits FF23 and FF24 in response to the clock signal CLK is t31 earlier than the rising time of the signal Sm2, the flip flop circuit FF23 outputs the power supply voltage up signal Vup being the inversion output signal as H level. In this case, the rising time of the output signal Sm1 is close to the latch time responsive to the clock signal CLK, and the control unit 15 determines that the delay time of the selected one delay path has no allowance. Accordingly, the control unit 15 performs control so as to increase the power supply voltage that is applied to the delay path, thereby shortening the delay time of the delay path.

On the other hand, when the latch time of the flip flop circuits FF23 and FF24 in response to the clock signal CLK is t32 later than the rising time of the signal Sm3, the flip flop circuit FF24 outputs the power supply voltage down signal Vdown as H level. In this case, the rising time of the output signal Sm1 is far from the latch time responsive to the clock signal CLK, and the control unit 15 determines that the delay time of the selected one delay path has allowance. Accordingly, the control unit 15 performs control so as to decrease the power supply voltage that is applied to the delay path, thereby lengthening the delay time of the delay path.

The power supply voltage control delay monitor operates as described above, and decreases the power supply voltage applied to the delay path so far as an appropriate delay time is obtained in the selected one delay path, thereby enabling the power efficiency to be improved.

[Exemplary Embodiment 5]

Figure 11:
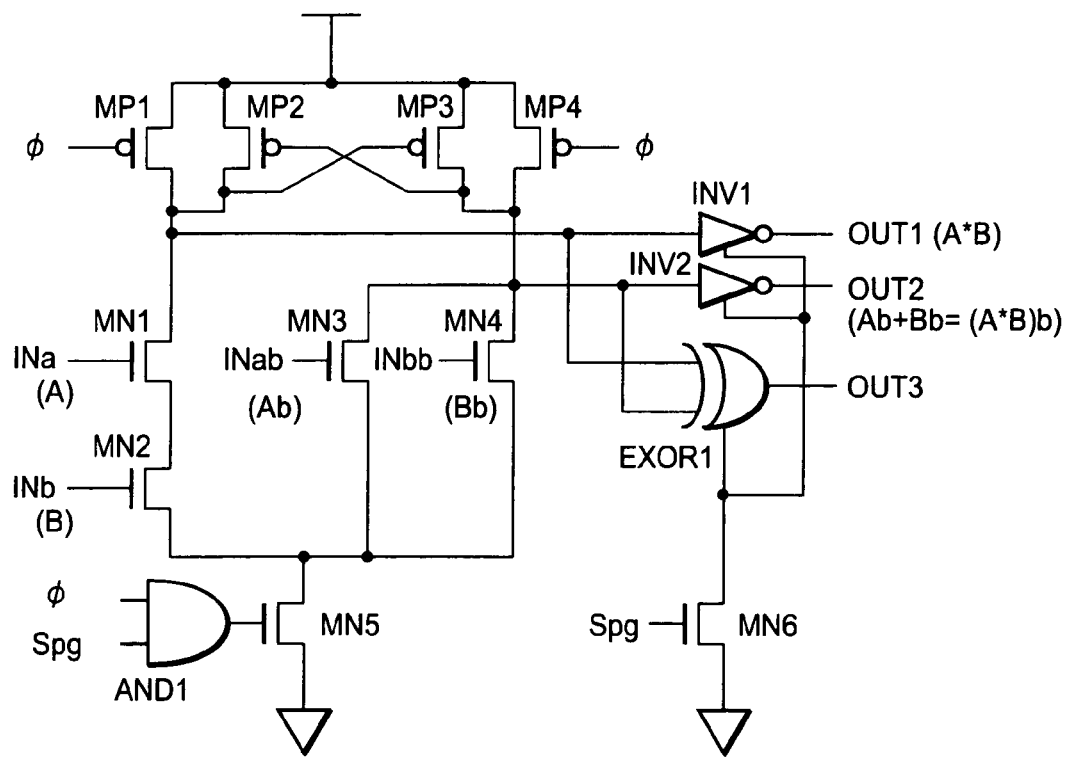
FIG. 11 is a circuit diagram showing a unit logic gate circuit according to a fifth exemplary embodiment of the present invention.

FIG. 11 is a circuit diagram showing a unit logic gate circuit according to a fifth exemplary embodiment of the present invention. The unit logic gate circuit shown in FIG. 11 is a circuit of a minimum element configuring the combinational logic circuit 21 of FIG. 2, or the combinational logic circuits 22a to 22d of FIG. 5, which configures an AND circuit operates complementarily.

The unit logic gate circuit includes PMOS transistors MP1 to MP4, NMOS transistors MN1 to MN6, inverter circuits INV1 and INV2, an AND circuit AND1, and an exclusive OR circuit EXOR1. The exclusive OR circuit EXOR1 exists only in the final stage of the combinational logic circuit configuring the delay path of FIG. 1, that is, in the unit logic gate circuit adjacent to the synchronous operation circuit 12. The PMOS transistors MP1 and MP4 have their sources connected to a power supply Vdd, respectively, and supply a speed evaluation clock signal φ from the control unit 15 to the respective gates. The PMOS transistors MP2 and MP3 have their sources connected to the power supply Vdd, respectively, and alternately connect the respective gates and drains.

The NMOS transistor MN1 has a drain connected to the drains of the PMOS transistors MP1 and MP2, the input end of the inverter circuit INV1, and one input end of the exclusive OR circuit EXOR1, a gate connected to an input terminal INa, and a source connected to the drain of the NMOS transistor MN2. The NMOS transistor MN2 has a gate connected to an input terminal INb, and a source connected to the drain of the NMOS transistor MN5. An output end of the inverter circuit INV1 is connected to an output terminal OUT1. It is assumed that logical values of signals supplied to the input terminals INa and INb, respectively, are A and B.

The NMOS transistor MN3 has a drain connected to the drains of the PMOS transistors MP3 and MP4, the input end of the inverter circuit INV2, and another input end of the exclusive OR circuit EXOR1, a gate connected to a terminal INab, and a source connected to the drain of the NMOS transistor MN5. The NMOS transistor MN4 has a drain connected to the drains of the NMOS transistors MP3 and MP4, a gate connected to a terminal INbb, and a source connected to the drain of the MNOS transistor MN5. An output end of the inverter circuit INV2 is connected to the NMOS transistor MN5. An output end of the exclusive OR circuit EXOR1 is connected to an output terminal OUT3. In this example, it is assumed that logical values of signals supplied to the input terminals INab and INbb, respectively, are Ab and Bb, and the logical values Ab and Bb are negative logic of the logical values A and B, respectively.

The AND circuit AND1 has one input end supplied with a speed evaluation clock signal φ, another input end supplied with a power gating signal Spg from the control unit 15, and an output end connected to the gate of the NMOS transistor MN5. The source of the NMOS transistor MN5 is grounded. The NMOS transistor MN6 has a source grounded, a gate supplied with the signal Spg, and a drain connected to the respective ground-side power supply terminals of the inverter circuits INV1, INV2, and the exclusive OR circuit EXOR1.

Figure 12:
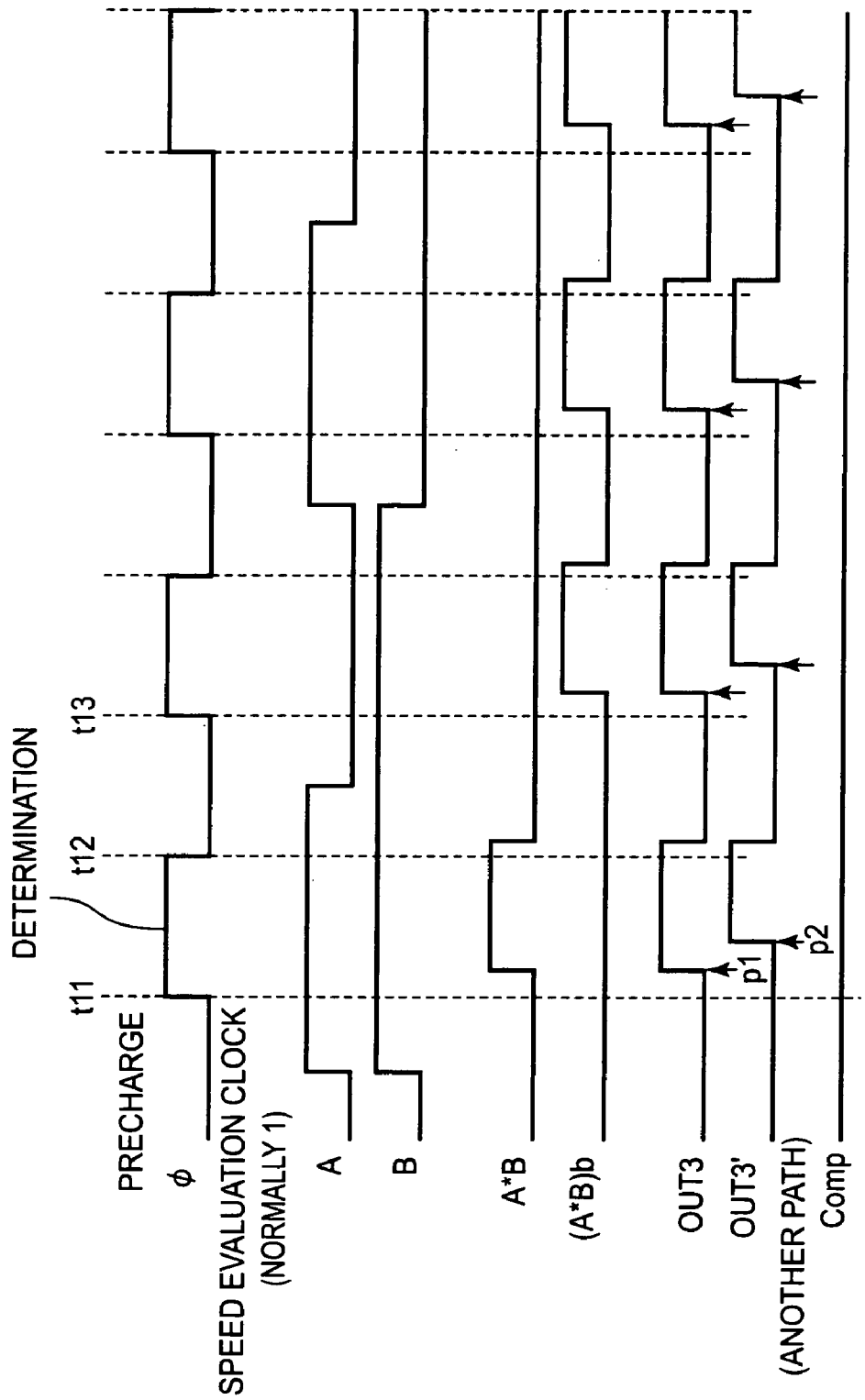
FIG. 12 is a timing chart showing the operation of the unit logic gate circuit according to the fifth exemplary embodiment of the present invention.

Subsequently, the operation of the unit logic gate circuit configured as described above will be described. FIG. 12 is a timing chart showing the operation of the unit logic gate circuit according to the fifth exemplary embodiment of the present invention. Referring to FIG. 12, a period during which the speed evaluation clock signal φ is in the L level is a precharge period, in which the PMOS transistors MP1 and MP4 turn on, the NMOS transistor MN5 turns off, and the input ends of the inverter circuits INV1 and INV2 are in the H level. Accordingly, the output ends of the inverter circuits INV1 and INV2, that is, the output terminals OUT1 and OUT2 are in the L level.

A period during which the speed evaluation clock signal φ is in the H level is a determination period of the delay time, in which the PMOS transistors MP1 and MP4 turn off, and the NMOS transistor MN5 turns on. Accordingly, in the determination period, a logical AND A*B of the logical values A and B is output from the output terminal OUT1. A logical OR Ab+Bb of the logical values Ab and Bb, that is, (A*B)b being the negative logic of the logical AND of A and B is output from the output terminal OUT2. In this way, the unit logic gate circuit is formed of a logic circuit operating complementarily with other input/output logic values representative of negative logics to one input/output logic values, respectively, and functions as a double rail logic circuit. Referring to FIG. 12, the outputs A*B and (A*B)b of the output terminals OUT1 and OUT2 are each indicated with an internal delay of the unit logic gate circuit.

The flip flop circuit 11 in FIG. 2 or the flip flop circuits FF2a to FF2d in FIG. 5 output only a positive logic side (Q), but are preferably configured so as to also output the above negative logic side (Qb).

The unit logic gate circuit operating as described above is configured as a dynamic circuit of the double rail logic circuit operating according to the logic level of the speed evaluation clock signal φ, and functions as the dynamic circuit during detection of the delay time through the delay detection unit. On the other hand, during the normal operation, the unit logic gate circuit holds the speed evaluation clock signal φ in the H level, and functions as a static circuit.

During the determination period, the output end of the exclusive OR circuit EXOR1, that is, the output terminal OUT3 outputs the exclusive OR of the logic values A and B, and has the internal delay of the unit logic gate circuit. In this case, in the unit logic gate circuit at a final stage of the delay path, the delay times (for example, rising times p1 and p2) of the output OUT3 of the exclusive OR of the logic values A and B are different between the different delay paths, and represented by, for example, OUT3 and OUT3' depending on a variation in the delay paths.

The length of the delay time attributable to the variation in the delay paths is detected by the delay detection unit 14 and the control circuit 15 as described in the exemplary embodiment 2, and a path (delay path) whose delay time is the fastest value or a middle value is selected.

When the unit logic gate circuit according to the fifth exemplary embodiment is applied to the combinational logic circuit 21 of the exemplary embodiment 1, the exclusive OR circuit EXOR1 is unnecessary.

[Exemplary Embodiment 6]

Figure 13:
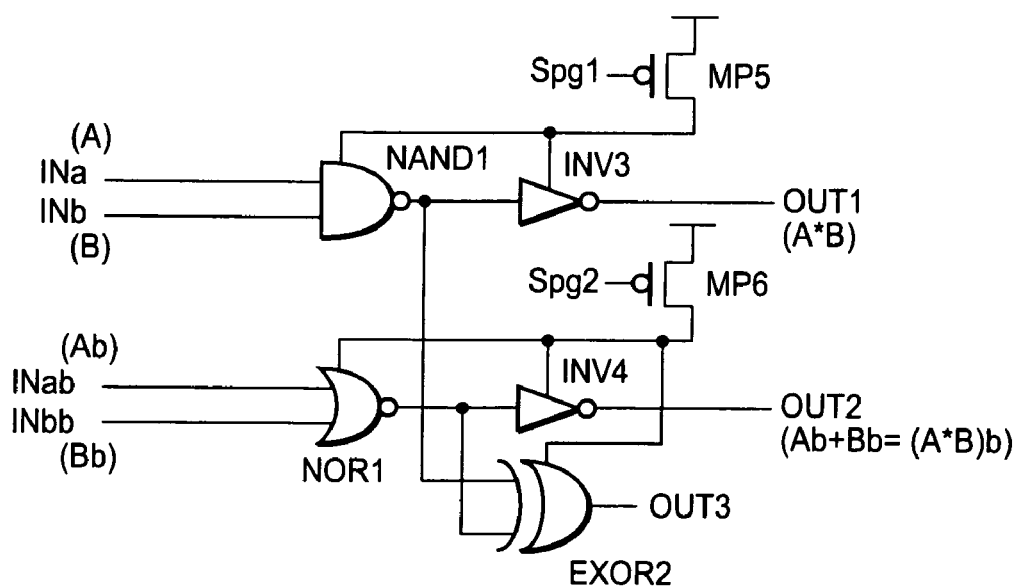
FIG. 13 is a circuit diagram showing a unit logic gate circuit according to a sixth exemplary embodiment of the present invention.

FIG. 13 is a circuit diagram showing a unit logic gate circuit according to a sixth exemplary embodiment of the present invention. The unit logic gate circuit shown in FIG. 13 is a circuit of a minimum element configuring the combinational logic circuit 21 of FIG. 2, or the combinational logic circuits 22a to 22d of FIG. 5, which configures an AND circuit operating complementarily.

The unit logic gate circuit includes PMOS transistors MP5 and MP6, inverter circuits INV3 and INV4, a NAND circuit NAND1, a NOR circuit NOR1, and an exclusive OR circuit EXOR2. The exclusive OR circuit EXOR2 exists only in the final stage of the combinational logic circuit configuring the delay path of FIG. 1, that is, in the unit logic gate circuit adjacent to the synchronous operation circuit 12.

The PMOS transistors MP5 and MP6 have their sources connected to a power supply Vdd, respectively, and supply power gating signals Spg1 and Spg2 from the control unit 15 to the respective gates. The PMOS transistor MP5 has a drain connected to the respective power supply terminals of the inverter circuit INV3 and the NAND circuit NAND1. The PMOS transistor MP6 has a drain connected to the respective power supply terminals of the inverter circuit INV4, the NOR circuit NOR1, and the exclusive OR circuit EXOR2.

The NAND circuit NAND1 has one input end connected to the input terminal INa, another input end connected to the input terminal INb, and an output end connected to the input end of the inverter circuit INV4 and another input end of the exclusive OR circuit EXOR2. The inverter circuit INV4 has an output end connected to the output terminal OUT2. The exclusive OR circuit EXOR2 has an output end connected to the output terminal OUT3. In this example, it is assumed that the logical values of signals supplied to the input terminals INa and INb, respectively, are A and B. It is assumed that logical values of signals supplied to the input terminals INab and INbb, respectively, are Ab and Bb, and the logical values Ab and Bb are negative logic of the logical values A and B, respectively.

Figure 14:
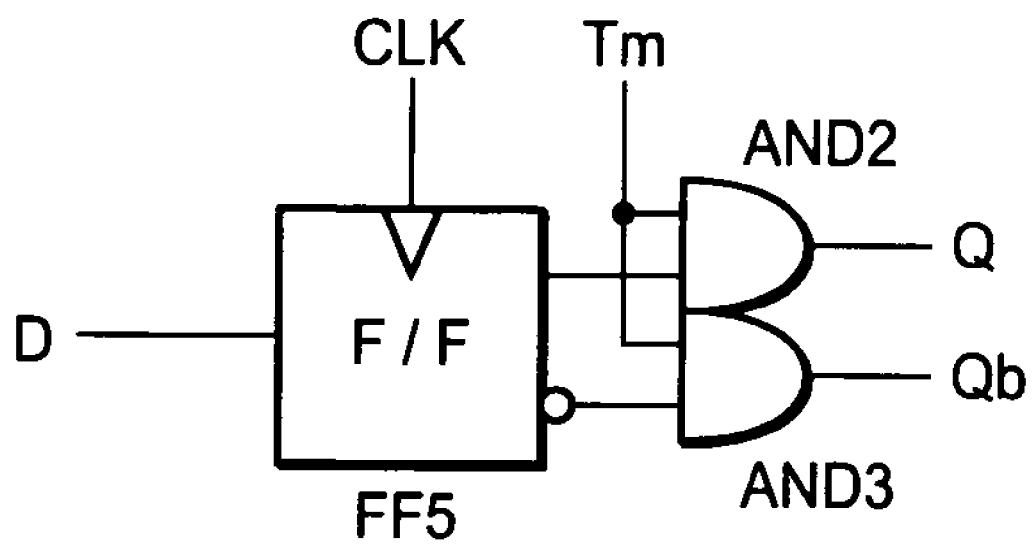
FIG. 14 is a circuit diagram showing a driver circuit at an initial stage of the unit logic gate circuit according to the sixth exemplary embodiment of the present invention.

The flip flop circuit FF11 in FIG. 2 or the flip flop circuits FF2a to FF2d in FIG. 5 output only a positive logic side (Q), but are preferably configured so as to also output the above negative logic side (Qb). FIG. 14 is a circuit diagram of a driver circuit at an initial stage of the unit logic gate circuit according to the sixth exemplary embodiment of the present invention, which includes a flip flop circuit FF5, and AND circuits AND2, AND3. The flip flop circuit FF5 corresponds to the flip flop circuit FF11 in FIG. 2, or the flip flop circuit FF2a to FF2d in FIG. 5. The AND circuit AND2 obtains the logical AND of the positive logic side output of the flip flop circuit FF5 and the timing signal Tm as the positive logic side output Q. The AND circuit AND3 obtains the logical AND of the negative logic side output of the flip flop circuit FF5 and the timing signal Tm as the negative logic side output Qb. Q and Qb are input to the unit logic gate circuit.

Subsequently, the operation of the unit logic gate circuit configured as described above will be described. FIG. 15 is a timing chart showing the operation of the unit logic gate circuit according to the sixth exemplary embodiment of the present invention. Referring to FIG. 15, a period during which the timing signal Tm is in the H level is a delay determination period and a normal operation period of the unit logic gate circuit, and the logic operation results corresponding to the logic values supplied to the input terminals INa, INb, INab, and INbb, respectively, are output to the output terminals OUT1 and OUT2. That is, the logical AND A*B of the logic values A and B is output from the output terminal OUT1. The logical OR Ab+Bb of the logic values Ab and Bb, that is, (A*B)b being the negative logic of the logic AND of A and B is output from the output terminal OUT2.

The unit logic gate circuit operating as described above is formed of a logic circuit operating complementarily as in the exemplary embodiment 5, and functions as the double rail logic circuit. The unit logic gate circuit is configured as a static circuit requiring no speed evaluation clock signal φ of the exemplary embodiment 5, and functions as the binary logic static circuit during detection of the delay time. The unit logic gate circuit functions as a single logic static circuit during the normal operation. That is, during detection of the delay time, the level of the power gating signals Spg1 and Spg2 is set to the L level, and the PMOS transistors MP5 and MP6 turn on. Accordingly, both of a path including the NAND circuit NAND1 and the inverter circuit INV3, and a path including the NOR circuit NOR1 and the inverter circuit INV4 function to form the double rail logic circuit. On the other hand, during the normal operation, only the level of the power gating signal Spg1 (or the signal Spg2) is set to the L level, and only the PMOS transistor MP5 (or the MP6) turns on. Accordingly, only one path including the NAND circuit NAND1 and the inverter circuit INV3 (NOR circuit NOR1, inverter circuit INV4) function to form a single rail logic circuit.

During the delay determination period, the output end of the exclusive OR circuit EXOR2, that is, the output terminal OUT3 outputs the exclusive OR of the logic values A and B with the internal delay of the unit logic gate circuit. In this case, in the unit logic gate circuit at the final stage of the delay path, the delay time of the output OUT3 of the exclusive OR of the logic values A and B is different between the different delay paths depending on a variation in the delay path.

The length of the delay time attributable to the variation in the delay paths is detected by the delay detection unit 14 and the control circuit 15 as described in the exemplary embodiment 2, and a path (delay path) whose delay time is the fastest value or a middle value is selected.

When the unit logic gate circuit according to the sixth exemplary embodiment is applied to the combinational logic circuit 21 of the exemplary embodiment 1, the exclusive OR circuit EXOR2 is unnecessary.

It is assumed that the respective disclosures of the abovementioned Patent Documents and so on are filed with citation in this specification. Within the framework of the whole disclosure (including the claims) of the present invention, the exemplary embodiments and the examples can be further modified and adjusted on the basis of the basic technical concept. Within the framework of the claims of the present invention, diverse combinations or selection of various disclosed elements can be conducted. That is, the present invention includes diverse deformations and modifications which would be performed by the ordinary skilled person according to the whole disclosure including the claims and the technical concept.

Further, it is noted that Applicant's intent is to encompass equivalents of all claim elements, even if amended later during prosecution.

What is claimed is:

1. A semiconductor integrated circuit device, comprising:
   a plurality of delay paths which are connected in parallel between synchronous operation circuits operating in synchronism with a clock signal and which enable transmission of a signal;
   a delay detection unit that detects respective delay times in the plurality of delay paths; and
   a control unit that selects one delay path from the plurality of delay paths based on a detection result of the delay detection unit, and controls blocking of signal transmission in the delay paths other than the selected one delay path,
   wherein the plurality of delay paths are each configured to include an active circuit that operates upon receiving a power supply, and wherein the control unit stops supplying the power supply to the active circuits in the delay paths other than the selected one delay path during a normal operation.

2. The semiconductor integrated circuit device according to claim 1,
   wherein each active circuit comprises a combinational logic circuit.

3. A semiconductor integrated circuit device, comprising:
   a plurality of delay paths which are connected in parallel between synchronous operation circuits operating in synchronism with a clock signal and which enable transmission of a signal;
   a delay detection unit that detects respective delay times in the plurality of delay paths; and
   a control unit that selects one delay path from the plurality of delay paths based on a detection result of the delay detection unit, and controls blocking of signal transmission in the delay paths other than the selected one delay path,
   wherein the control unit selects, as one delay path, a delay path whose delay time is a minimum value among the plurality of delay paths.

4. The semiconductor integrated circuit device according to claim 3, wherein the delay detection unit includes two registers different in latch timing from each other in correspondence with the plurality of delay paths, respectively, and wherein the control unit selects one delay path based on a delay time order in the plurality of delay paths, which are obtained based on latch data of the two registers in a case where the latch timing is changed.

5. The semiconductor integrated circuit device according to claim 4, wherein one of the two registers operates in the latch timing of the clock signal during a normal operation.

6. A semiconductor integrated circuit device, comprising:
   a plurality of delay paths which are connected in parallel between synchronous operation circuits operating in synchronism with a clock signal and which enable transmission of a signal;
   a delay detection unit that detects respective delay times in the plurality of delay paths; and
   a control unit that selects one delay path from the plurality of delay paths based on a detection result of the delay detection unit, and controls blocking of signal transmission in the delay paths other than the selected one delay path,
   wherein each delay path comprises a logic circuit operating complementarily, during detection of the delay time by the delay detection unit.

\* \* \* \* \*